United States Patent
Tsunoda et al.

(10) Patent No.: US 12,127,404 B2
(45) Date of Patent: Oct. 22, 2024

(54) SEMICONDUCTOR STORAGE DEVICE WITH WALL PROTIONS FOR ISOLATIOING BLOCKS

(71) Applicant: Kioxia Corporation, Tokyo (JP)

(72) Inventors: Kazuaki Tsunoda, Kuwana (JP); Kazuhiro Washida, Yokkaichi (JP)

(73) Assignee: Kioxia Corporation, Tokyo (JP)

(*) Notice: Subject to any disclaimer, the term of this patent is extended or adjusted under 35 U.S.C. 154(b) by 613 days.

(21) Appl. No.: 17/304,186

(22) Filed: Jun. 16, 2021

(65) Prior Publication Data

US 2022/0208782 A1 Jun. 30, 2022

(30) Foreign Application Priority Data

Dec. 28, 2020 (JP) .................................. 2020-218986

(51) Int. Cl.
*H10B 43/10* (2023.01)
*H10B 43/27* (2023.01)

(52) U.S. Cl.
CPC ............. *H10B 43/10* (2023.02); *H10B 43/27* (2023.02)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS 9,076,879 B2 * 7/2015 Yoo .......................... H01L 29/04
9,711,527 B2 7/2017 Noda et al.
(Continued)

FOREIGN PATENT DOCUMENTS

JP 2019-161059 A 9/2019

*Primary Examiner* — Didarul A Mazumder
*Assistant Examiner* — Gustavo G Ramallo
(74) *Attorney, Agent, or Firm* — Oblon, McClelland, Maier & Neustadt, L.L.P.

(57) ABSTRACT

According to one embodiment, a semiconductor storage device includes a first stacked body, plate-shaped portions, and a wall portion. The first stacked body, in which electrically conductive layers and first insulating layers are stacked alternately one by one, includes pillar bodies that penetrate the electrically conductive layers in a stacking direction of the electrically conductive layers. The plate-shaped portions extend in a first direction intersecting the stacking direction and divide the first stacked body into blocks. The wall portion includes first and second portions. The first and second portions respectively extend in a second direction intersecting the first direction and the stacking direction and are arranged in the stacking direction. The second portion includes an outer edge connected to a side surface of the first portion and inclined with respect to the staking direction at an angle larger than an angle defined by the side surface and the stacking direction.

20 Claims, 10 Drawing Sheets

(56) References Cited

U.S. PATENT DOCUMENTS

| | | | |
|---|---|---|---|
| 9,780,104 B2 | 10/2017 | Nomachi et al. | |
| 2014/0273373 A1* | 9/2014 | Makala | H01L 29/7926 |
| | | | 438/270 |
| 2019/0287995 A1 | 9/2019 | Oike et al. | |
| 2019/0371809 A1* | 12/2019 | Yun | H10B 41/27 |
| 2020/0161333 A1 | 5/2020 | Oike et al. | |
| 2020/0168547 A1 | 5/2020 | Lim et al. | |
| 2020/0295033 A1* | 9/2020 | Sakamoto | H10B 41/27 |
| 2021/0050370 A1 | 2/2021 | Oike et al. | |
| 2023/0354606 A1* | 11/2023 | Wada | H10B 43/10 |

\* cited by examiner

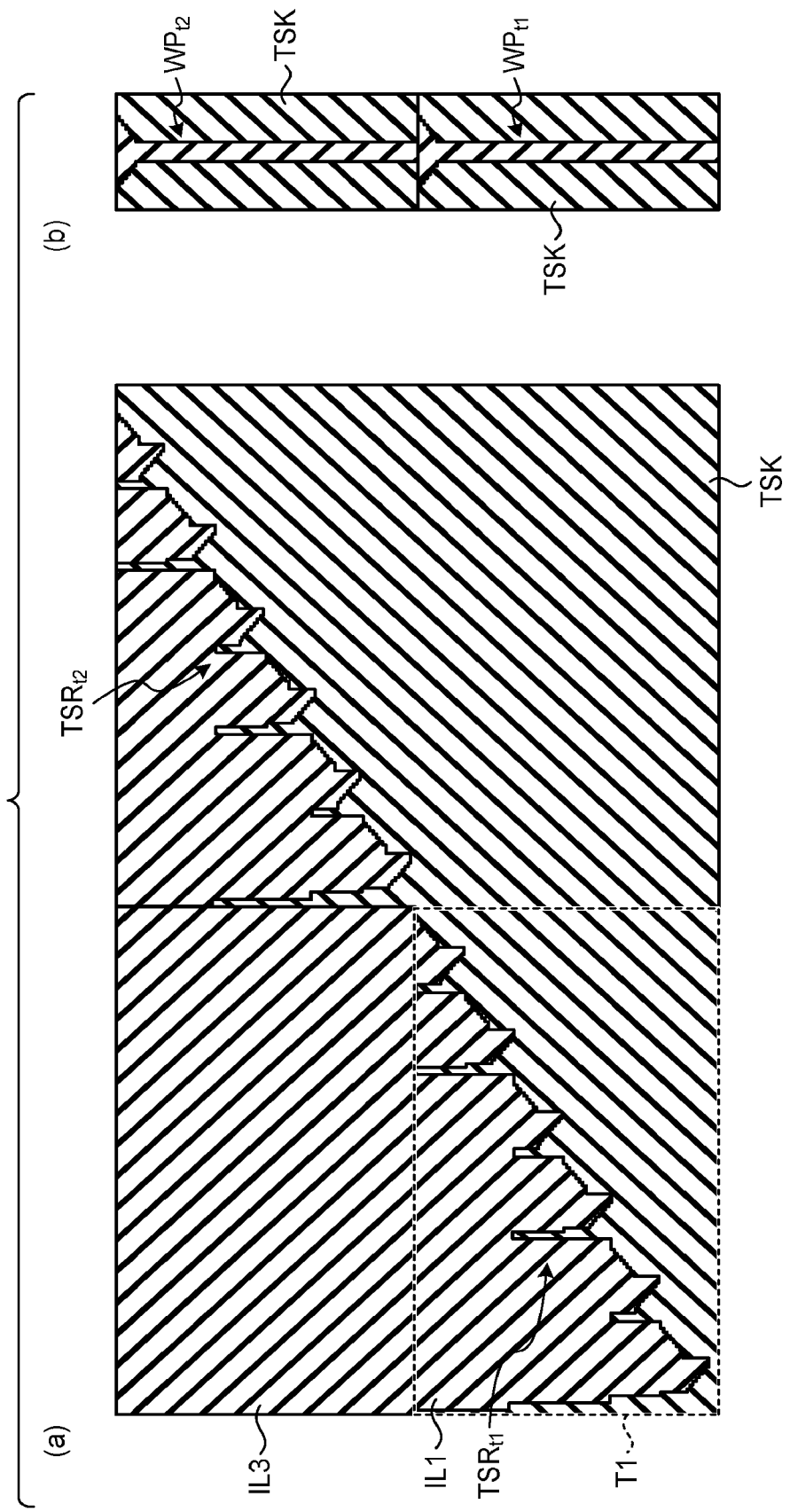

SEMICONDUCTOR STORAGE DEVICE WITH WALL PROTIONS FOR ISOLATIOING BLOCKS

CROSS-REFERENCE TO RELATED APPLICATION(S)

This application is based upon and claims the benefit of priority from Japanese Patent Application No. 2020-218986, filed on Dec. 28, 2020; the entire contents of which are incorporated herein by reference.

FIELD

Embodiments described herein relate to a semiconductor storage device.

BACKGROUND

Some semiconductor storage devices having a three-dimensional structure include a stacked body where plural electrically conductive layers and plural insulating layers are stacked alternately one by one. In the stacked body, plural memory pillars are formed which penetrate in a stacking direction of the stacked body, and memory cells are formed in portions where the memory pillars and the electrically conductive layers as word lines are opposed to each other. Such memory cells are arranged in a cell array area, and the cell array area is divided into plural blocks by plural plate-shaped portions.

Here, the electrically conductive layers are formed by being replaced from plural sacrificial films within a preliminarily formed stacked body where the plural sacrificial films and the plural insulating layers are stacked alternately one by one. During such replacement, the sacrificial films may be replaced with the electrically conductive layers to wrap around end portions of the plate-shaped portions. In other words, the resultant electrically conductive layers may become continuous around the plate-shaped end portions. If this happens, the cell array area cannot be electrically divided into the blocks by the plate-shaped portions.

BRIEF DESCRIPTION OF THE DRAWINGS

FIG. 8 is a cross-sectional view schematically illustrating a stair portion configured in two tiers;

DETAILED DESCRIPTION

Figure 1:
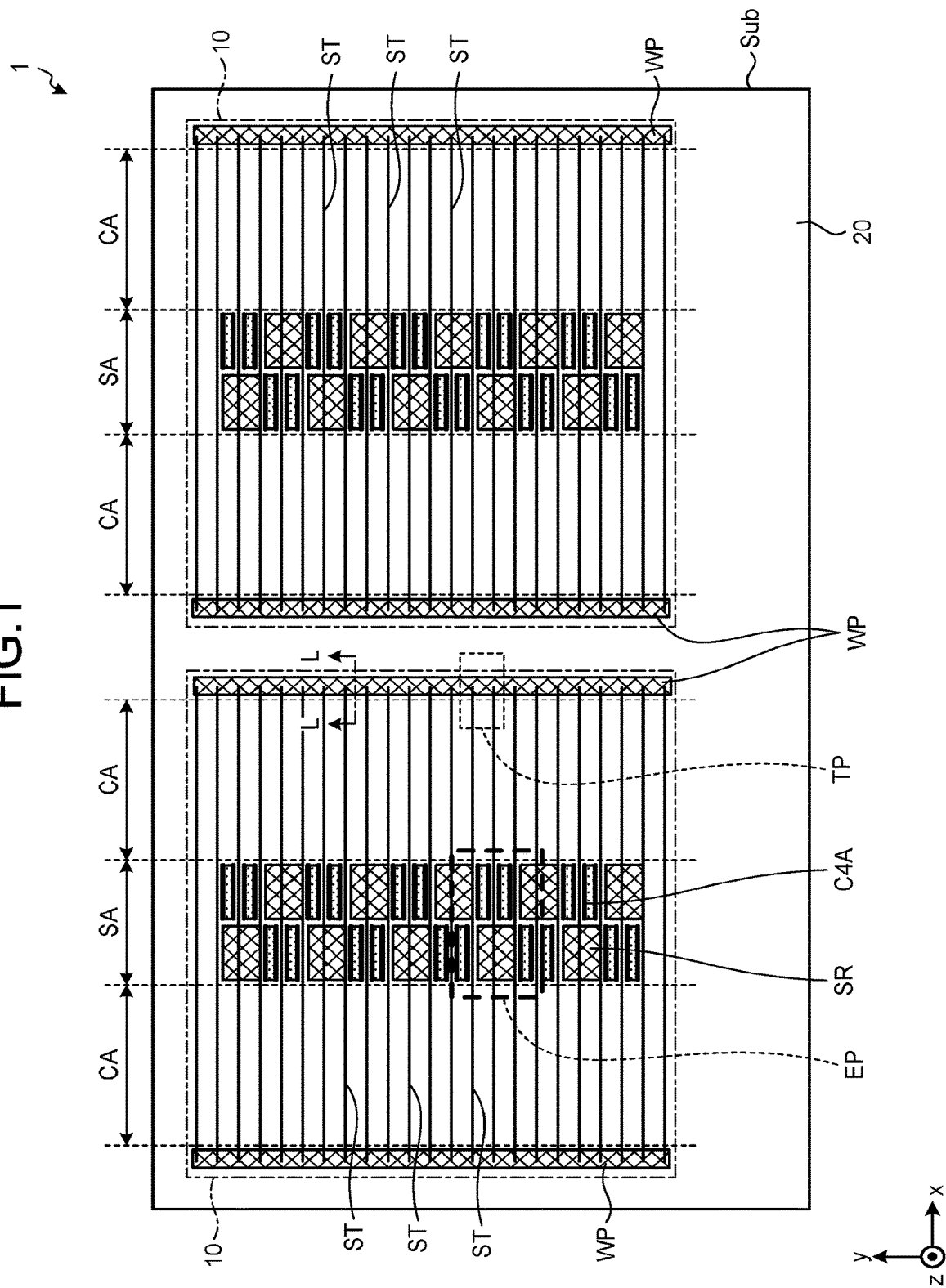
FIG. 1 is a top plan view schematically illustrating one example of a semiconductor storage device according to one embodiment.

According to one embodiment, a semiconductor storage device is provided which includes a first stacked body, a plurality of plate-shaped portions, and a wall portion. The first stacked body, in which a plurality of electrically conductive layers and a plurality of first insulating layers are stacked alternately one by one, includes a plurality of pillar bodies that penetrate the plurality of electrically conductive layers and the plurality of first insulating layers in a stacking direction of the plurality of electrically conductive layers. Memory cells are formed in portions of the pillar bodies that are opposed to at least one of the plurality of electrically conductive layers. The plurality of plate-shaped portions extend in a first direction intersecting the stacking direction and divide the first stacked body into a plurality of blocks. The plurality of plate-shaped portions include first insulating material. The wall portion includes second insulating material and includes a first portion and a second portion. The first portion and the second portion respectively extend in a second direction intersecting the first direction and the stacking direction and are arranged in the stacking direction. The second portion includes an outer edge connected to a side surface of the first portion extending in the second direction and the stacking direction, and inclined with respect to the staking direction at an angle larger than an angle defined by the side surface and the stacking direction.

Non-limiting, exemplary embodiments of the present invention will now be described with reference to the accompanying drawings. In the drawings, the same or corresponding reference marks are given to the same or corresponding members or components, and redundant explanations will be omitted. It is to be noted that the drawings are illustrative of the invention, and there is no intention to indicate scale or relative proportions among the members or components, or between thicknesses of various layers. Therefore, the specific thickness or size would be determined by a person having ordinary skill in the art in view of the following non-limiting embodiments.

FIG. 1 is a top plan view schematically illustrating an example of a semiconductor storage device 1 according to one embodiment. As illustrated in FIG. 1, the semiconductor storage device 1 has a chip-shaped substrate Sub, a peripheral circuit portion (described later), two memory portions 10 (also referred to as planes), and an encompassing portion 20. The peripheral circuit portion is formed above the substrate Sub, and the two memory portions 10 are formed above the peripheral circuit portion and arranged next to each other along a lengthwise direction (x direction) of the semiconductor storage device 1. Additionally, in each of the memory portions 10, a wall portion WP, a cell array area CA, a stair area SA, another cell array area CA, and another wall part WP are arranged in this order along the x direction. The encompassing portion 20 encompasses the memory portions 10.

Additionally, plural plate-shaped portions ST are provided inside the memory portion 10. The plate-shaped portions ST each extend in the x direction, with one end portion thereof located within the wall portion WP on one side of the memory portion 10, and with the other end portion thereof located within the wall portion WP on the other side. The plate-shaped portions ST divide the cell array areas CA, the stair area SA, and the cell array area CA into plural blocks BLK (see FIG. 2). Moreover, as described later, the plate-shaped portions ST extend also in the z direction and thus penetrate through the stacked body constituting the memory portion 10 and terminate in a source line (described later). In the present embodiment, the plate-shaped portions ST each have a liner layer LL (FIG. 2) and an electrically conductive portion EC inside the liner layer LL. The liner layer LL is formed of, for example, insulating material such as silicon oxide and the like, and the electrically conductive portion EC is formed of, for example, metal such as tungsten, molybdenum, and the like. The conductive portion EC is connected to the source line, and is capable of functioning as a source contact. Note that the plate-shaped portions ST may be formed, as a whole, of insulating material such as silicon oxide and the like in other embodiments.

Figure 2:
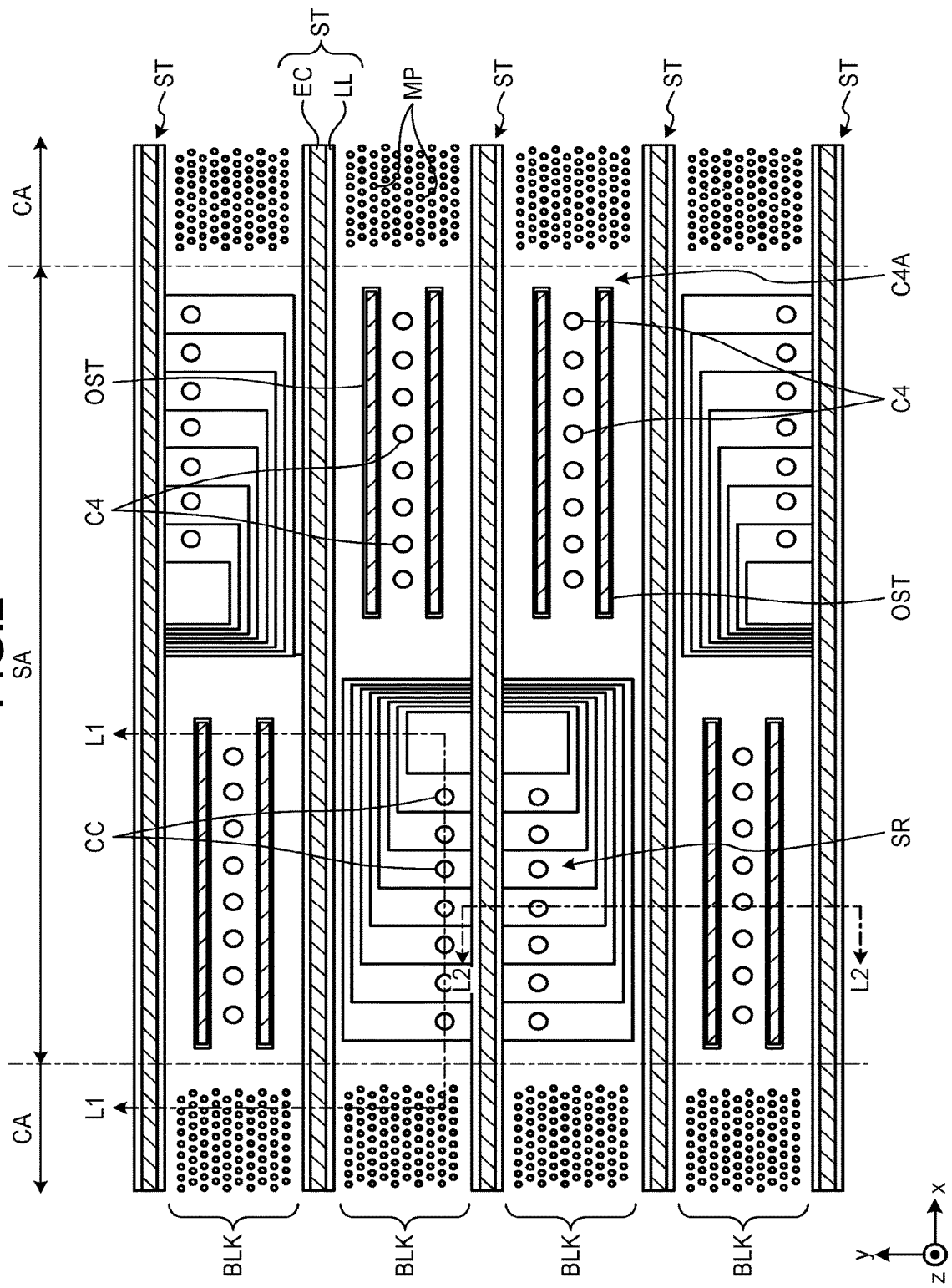
FIG. 2 is a partially enlarged top view of a cell array area and a stair area of the semiconductor storage device according to the embodiment.
Figure 3A:
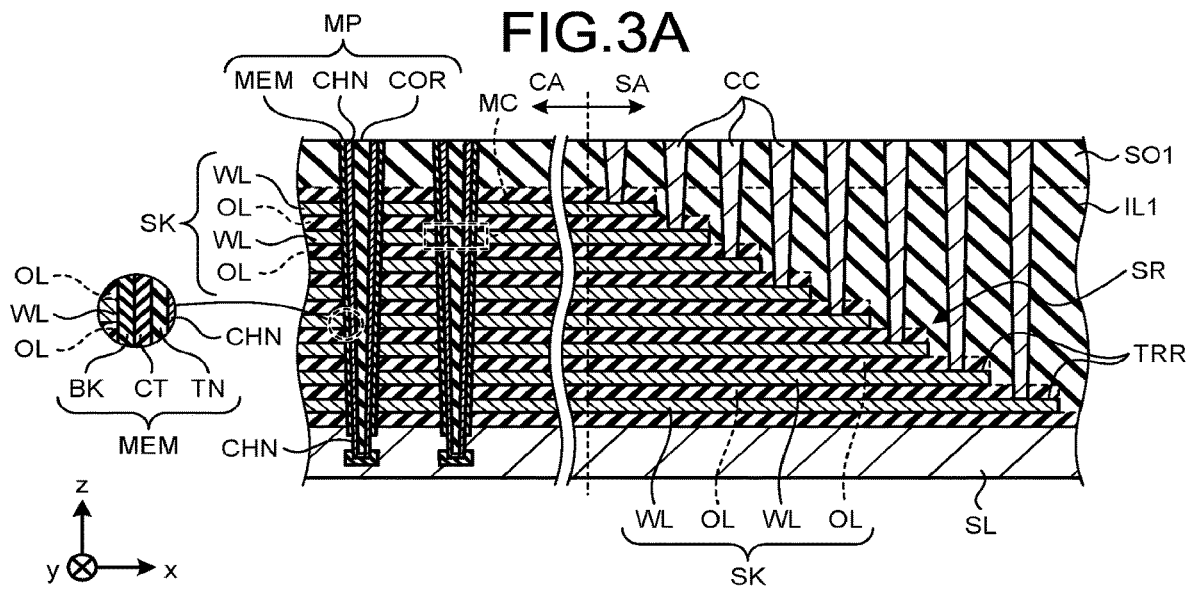
FIG. 3A is a cross-sectional view taken along an L1-L1 line in FIG. 2.
Figure 3B:
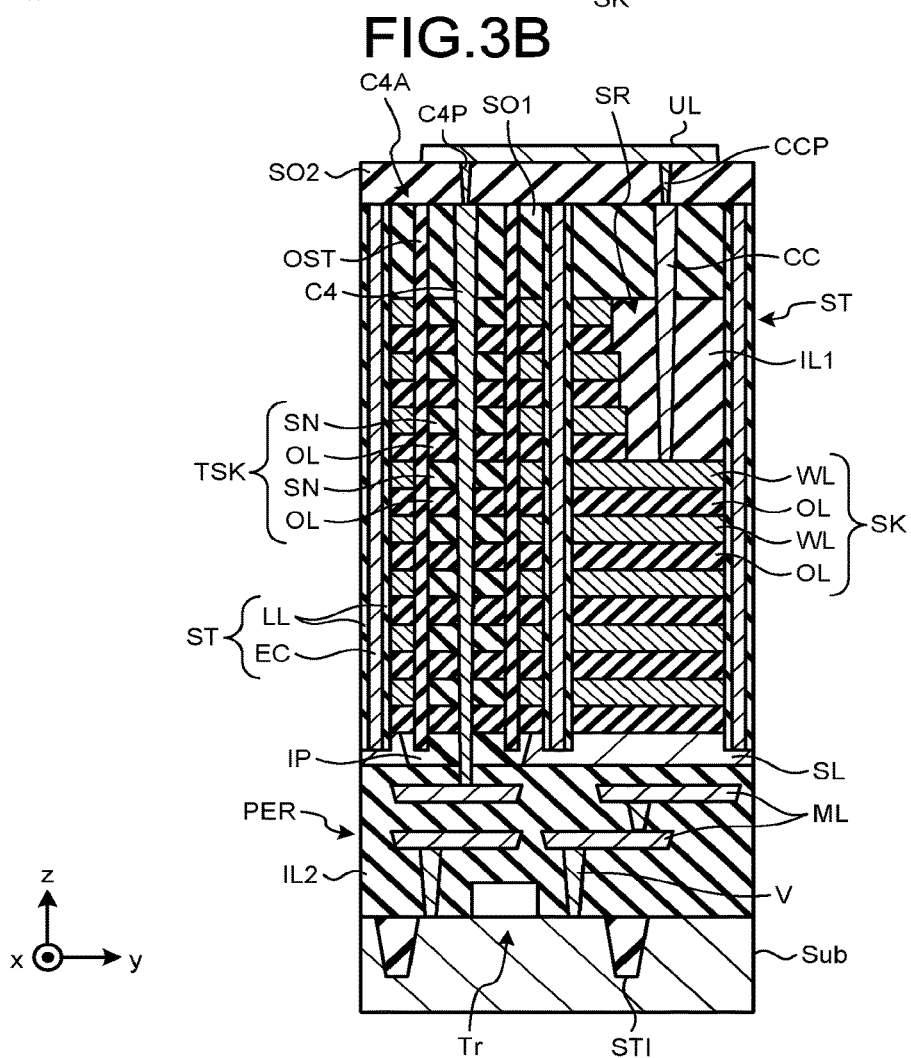
FIG. 3B is a cross-sectional view taken along an L2-L2 line in FIG. 2.

In the following, the cell array area CA and the stair area SA are described with reference to FIG. 2 and FIGS. 3A and 3B. FIG. 2 is a partially enlarged top view of the cell array area CA and the stair area SA, corresponding to a region EP in FIG. 1. FIG. 3A is a cross-sectional view taken along an L1-L1 line in FIG. 2, and FIG. 3B is a cross-sectional view taken along an L2-L2 line in FIG. 2. Note that, in FIG. 3A, structures are not illustrated below a source line SL and above an inter-layer insulating film IL1, for explanatory convenience.

Referring to FIG. 2, the stair area SA has a pair of a stair portion SR and a through-contact portion C4A in each of the plural blocks BLK divided by the plate-shaped portions ST. The two stair portions SR are arranged symmetrically and the two through-contact portions C4A are arranged symmetrically, while interposing the plate-shaped portion ST therebetween, and the two stair portions SR and the two through-contact portions C4A respectively arranged symmetrically are arranged alternately along the y direction. Moreover, in the cell array area CA, plural memory pillars MP are provided which penetrate through a stacked body (described later) in the z direction. The memory pillars MP are arranged in lattice pattern in an x-y plan view.

Referring to FIG. 3A, the cell array area CA is provided with the stacked body SK where plural electrically conductive layers WL and plural insulating layers OL are stacked alternately one by one in the z direction. The plural memory pillars MP penetrate through the plural electrically conductive layers WL and the plural insulating layers OL of the stacked body SK in the z direction, and terminate within the source line SL provided below the stacked body SK. Memory cells MC are formed in portions where the plural electrically conductive layers WL are opposed to the memory pillars MP. The source line SL may be formed of, for example, conductive polycrystalline silicon.

The memory pillars MP have a substantially columnar shape, and each include a core layer COR, a channel layer CHN, and a memory film MEM that are formed in this order from the center to the outside thereof. In other words, the channel layer CHN is formed to cover sidewalls and a bottom surface of the core layer COR formed in the center of the memory pillar MP, and the memory film MEM is formed to cover sidewalls and a bottom surface of the channel layer CHN. However, in this case, the memory film MEM is not formed around the channel layer CHN in a predetermined depth of the source line SL, and the channel layer CHN is directly in contact with the source line SL. Here, the core layer COR may be formed of, for example, silicon oxide and the like; and the channel layer CHN may be formed of, for example, conductive polycrystalline silicon, amorphous silicon, and the like. Additionally, as illustrated in FIG. 3A, the memory film MEM has a tunneling insulation layer TN, a charge storage layer CT, and a block insulating layer BK that are formed along a direction from the center to the outside of memory pillar MP. The tunneling insulation layer TN and the block insulating layer BK may be formed of, for example, silicon oxide and the like, and the charge storage layer CT may be formed of, for example, silicon nitride and the like. As described above, the channel layer CHN serving as a lateral surface of the memory pillar MP is in contact with the source line SL, and thus the memory pillar MP and the source line SL are electrically connected with each other.

The electrically conductive layers WL and the insulating layers OL of the stacked body SK extend to the stair area SA along the x direction, and are processed into a shape of stairs in the stair area SA. Specifically, in the stair area SA, plural pairs of the electrically conductive layer WL and the insulating layer OL of the stacked body SK are processed to have shorter extending lengths in the x direction when located more distant from the source line SL in the z direction. With this, the stair portion SR is formed. On the other hand, the electrically conductive layers WL and the insulating layers OL of the stacked body SK extend continuously in the x direction in an area extending along at least one plate-shaped portion ST located in the y direction with respect to the stair portion SR (see FIG. 2). With this, the electrically conductive layers WL function as common word lines for the two cell array areas CA arranged on both sides of the stair area SA in the x direction. Note that the lowermost electrically conductive layer WL and the uppermost electrically conductive layer WL in the z direction in the stacked body SK may function as respective selection gate lines.

An inter-layer insulating film IL1 is formed over the stair portion SR. The inter-layer insulating film IL1 may be formed of an insulating material that is the same as that of the insulating layer OL (e.g., silicon oxide). With this, the inter-layer insulating film IL1 and the insulating layers OL become substantially an integrated insulating film, within which the electrically conductive layers WL extend with different lengths in the x direction, and thus terrace surfaces TRR are provided, respectively. Contacts CC penetrate through the inter-layer insulating film IL1 (and the insulating layers OL) and land on corresponding terrace surfaces TRR.

The insulating film SO1 is formed on the inter-layer insulating film IL1. The insulating film SO1 may be formed of, for example, silicon oxide.

Next, referring to FIG. 3B, at least one transistor Tr is formed in an area defined by element isolation portions STI on a superficial layer of the substrate Sub. An inter-layer insulating film IL2 is formed on the substrate Sub. In the inter-layer insulating film IL2, electric lines ML and vias V are formed which are connected to a diffusion layer (not illustrated) and the like of the transistor Tr. A peripheral circuit portion PER is constituted by the transistor Tr, the vias V, the electric lines ML, and the inter-layer insulating film IL2. The peripheral circuit portion PER may include, for example, a row decoder and a sense amplifier circuit. The row decoder identifies an area in which the memory cells to be operated are included, and the sense amplifier circuit senses data stored in the memory cells.

The stacked body SK is arranged above the peripheral circuit portion PER with the source line SL interposed therebetween. The plate-shaped portion ST penetrates through the insulating film SO1 and the stacked body SK, and terminates within the source line SL. In the illustrated example, the stair portion SR is provided between the center plate-shaped portion ST and the right plate-shaped portion ST; and the through-contact portion C4A is provided between the center plate-shaped portion ST and the left plate-shaped portion ST. The stair portion SR is provided with the contact CC penetrating through the insulating film SO1 and the inter-layer insulating film IL1 thereby to be connected with the electrically conductive layer WL. The contact CC is connected to an upper electric line UL formed on the insulating film SO2 through a plug CCP embedded within the insulating film SO2 formed on the insulating film SO1.

As illustrated in FIG. 3B, the through-contact portion C4A has two plate-shaped bodies OST, a stacked body TSK provided between the two plate-shaped bodies OST, and a through-contact C4 penetrating through the insulating film SO1 and the stacked body TSK. The plate-shaped bodies OST penetrate through the insulating film SO1 and between the stacked body SK and the stacked body TSK, and terminate within an insulation portion IP provided locally in the source line SL. Additionally, the plate-shaped bodies OST extend in the x direction as with the plate-shaped portion ST as illustrated in FIG. 2. However, the plate-shaped bodies OST are shorter than the plate-shaped portion ST and remain in the through-contact portion C4A of the stair area SA. The plate-shaped bodies OST are formed of silicon oxide.

In the stacked body TSK between the two plate-shaped bodies OST, plural silicon nitride layers SN and insulating layers OL, e.g., formed of silicon oxide, are stacked alternately one by one. The silicon nitride layers SN of the stacked body TSK are so-called sacrificial films, and such sacrificial films are replaced with the electrically conductive layers WL as described later, according to which the stacked body SK is obtained. However, the silicon nitride layers SN are not replaced with the electrically conductive layers WL between the two plate-shaped bodies OST, and thus the stacked body TSK remains therein. Because the through-contact C4 penetrates through the electrically insulative stacked body TSK, the through-contact C4 is electrically insulated from the electrically conductive layers WL.

The through-contact C4, which may be formed of, for example, a metal such as tungsten, molybdenum, and the like, is connected at an upper end thereof to an upper electric line UL through a plug C4P embedded in the insulating film SO2. Additionally, a bottom end of the through-contact C4 is connected to the electric line ML in the peripheral circuit portion PER. Therefore, the peripheral circuit portion PER and the electrically conductive layer WL (word line) are electrically connected to each other through the through-contact C4, the plug C4P, the upper electric line UL, the plug CCP, and the contact CC.

Note that while eight layers of the electrically conductive layers WL are illustrated in FIG. 3A and FIG. 3B, the number of electrically conductive layers WL, without being limited to this, may be determined arbitrarily. For example, forty-eight, sixty-four, or ninety-six layers of the electrically conductive layers may be formed.

Figure 4A:
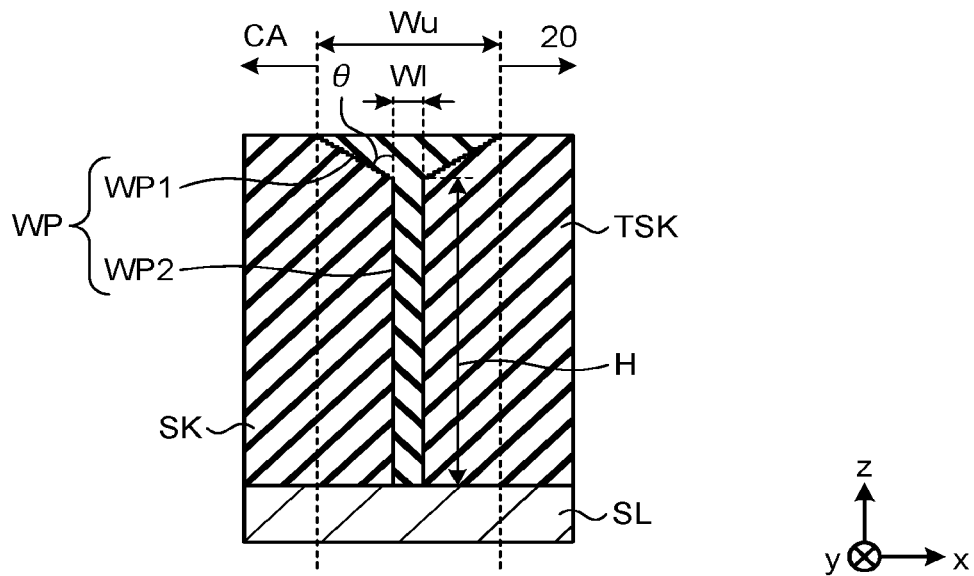
FIG. 4A is a cross-sectional view, taken along an L-L line of FIG. 1, illustrating a wall portion of the semiconductor storage device according to the embodiment.
Figure 4B:
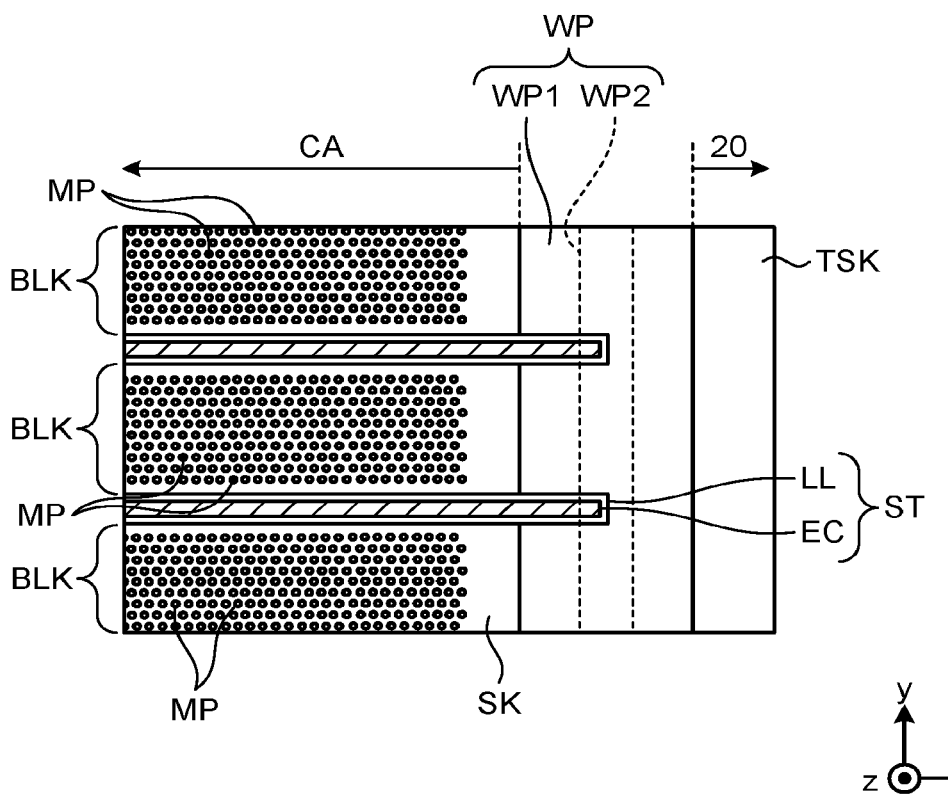
FIG. 4B is a top plan view illustrating the wall portion and corresponding to an area TP of FIG. 1.

Next, referring to FIG. 4A and FIG. 4B, a wall portion WP is described. FIG. 4A is a cross-sectional view taken along an L-L line of FIG. 1, and FIG. 4B is a top plan view corresponding to an area TP of FIG. 1. Note that, in FIG. 4A, a structure above the wall portion WP and the stacked bodies SK, TSK is not illustrated for the sake of convenience. Additionally, illustration is also omitted about the electrically conductive layers WL and the insulating layers OL in the stacked body SK, and the insulating layers OL and the silicon nitride layers SN in the stacked body TSK.

As illustrated in FIG. 4A, the wall portion WP has a funnel-like cross-sectional shape. For the sake of explanation in the following, an upper part of the wall portion WP is referred to as a funnel portion WP1, and a lower part of the wall portion WP is referred to as a rising portion WP2. The rising portion WP2 rises from the upper surface of the source line SL and extends in the z direction. The funnel portion WP1 is provided on the rising portion WP2, has a same width in the x direction at a bottom thereof as the rising portion WP2, and becomes wider upward along the z direction. With this, the funnel portion WP1 has an outer edge shape (x-direction side) inclined at an angle θ greater than an angle of a y-z side surface (x-direction outer edge) of the rising portion WP2 with respect to the z direction. In the illustrated example, the angle defined by the y-z side surface of the rising portion WP2 and the z direction is substantially zero. However, because the rising portion WP2 tends to be narrower toward the source line SL when formed through an etching process of the stacked body TSK as explained later, the y-z side surface of the rising portion WP2 may be slightly inclined with respect to the z direction as a whole.

Even in this case, the outer edge of the funnel portion WP1 is inclined with respect to the z direction at an angle θ (FIG. 4A) greater than an inclined angle (i.e., inclined angle of the x-direction outer edge of the rising portion WP2) as the entire y-z side surface of the rising portion WP2. More specifically, the funnel portion WP1 has two outer edges that oppose each other, and opposing lengths thereof become larger along the z direction. In other words, when a width in the x direction at the lower end of the funnel portion WP1 is Wl (a width of the rising portion WP2 in the x direction), and a width in the x direction at the upper end of the funnel portion WP1 is Wu, a relationship of Wu>Wl is satisfied. Additionally, the two outer edges of the funnel portion WP1 are symmetric with respect to the center of the funnel portion WP1 in the x direction. Moreover, the wall portion WP is in contact with the electrically conductive layers WL and the insulating layers OL (not illustrated in FIG. 4A) of the stacked body SK on the cell array area CA side (or, on the left outer edge of the funnel portion WP1 in the drawing). On the other hand, the wall portion WP is in contact with the silicon nitride layers SN and the insulating layers OL (not illustrated in FIG. 4A) of the stacked body TSK on the encompassing portion 20 side (or, on the right outer edge of the funnel portion WP1 in the drawing). Furthermore, it may be described that the wall portion WP extends in the y direction and the z direction, and divides the memory portion 10 and the encompassing portion 20 of the semiconductor storage device 1 in the x direction.

Furthermore, the left outer edge of the funnel WP1 in the drawing is defined by stairs having as steps plural pairs of the electrically conductive layer WL and the insulating layer OL in the stacked body SK, similarly with the stair portion SR explained with reference to FIG. 3A. In other words, the electrically conductive layers WL serving as the terrace surfaces of the stairs, when located more distant from the rising portion WP2 in the z direction, terminate closer to the cell array area CA. On the other hand, the right outer edge of the funnel portion WP1 is defined by stairs having as steps plural pairs of the silicon nitride layer SN and the insulating layer OL in the stacked body TSK. The silicon nitride layers SN serving as the terrace surfaces of the stairs, when located more distant from the rising portion WP2 in the z direction, terminate more distant from the cell array area CA. With such a configuration, a width of the funnel portion WP1 in the x direction changes in steps along the z direction. The reason why such a shape is obtained is that the wall portion WP is formed in parallel with forming the stair portion SR as described later.

Additionally, a relationship of H/Wl>0.5 is satisfied where H is a height of the rising portion WP2. Namely, a height of the rising portion WP2 is greater than half of the width (equal to Wl). As described later, the rising portion WP2 is formed by filling, for example, silicon oxide into a slit GPW (described later) for the rising portion WP2. When a ratio H/Wl of the height with respect to the width in the rising portion WP2 is 0.5 or less, voids, thin gaps, and the like may be caused in the silicon oxide filled into the slit GPW. Therefore, the relationship of H/Wl>0.5 may be satisfied.

Next, referring to FIG. 4B, the cell array area CA is arranged on the left side of the wall portion WP, and the memory pillar MP (FIG. 3A) penetrating through the stacked body SK is arranged in staggered lattice in x-y plane view in this embodiment. Additionally, the slits ST, which divide the cell array area CA in the y direction, extend in the x direction, and end portions thereof in the x direction are located within the wall portion WP. More specifically, the end portions of the slits ST in the x direction terminate within the rising portion WP2 of the wall portion WP. However, the end portions of the slits ST in the x direction may be positioned beyond the rising portion WP2 in the x direction. In other words, the slits ST may extend in the x direction and at least contact with the rising portion WP2.

Note that, in the stair portion SR formed by the same processes as the wall portion WP, the y-z cross-sectional shape at the steps thereof on a lower side may be processed to be substantially similar to a cross-section of the wall portion WP illustrated in FIG. 4A.

Figure 5:
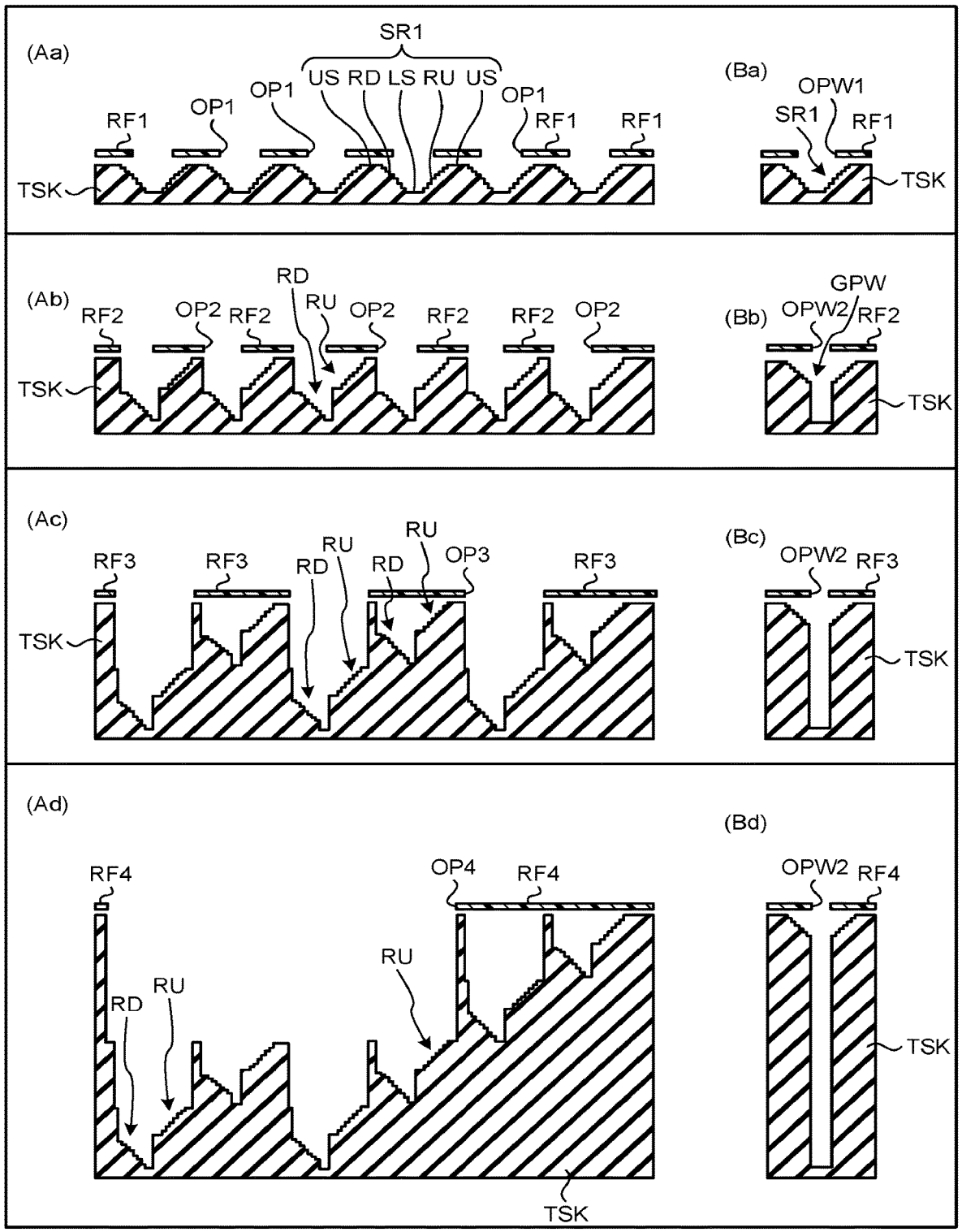
FIG. 5 is partial cross-sectional views explaining a method of forming a stair portion and the wall portion of the semiconductor storage device according to the embodiment.
Figure 6:
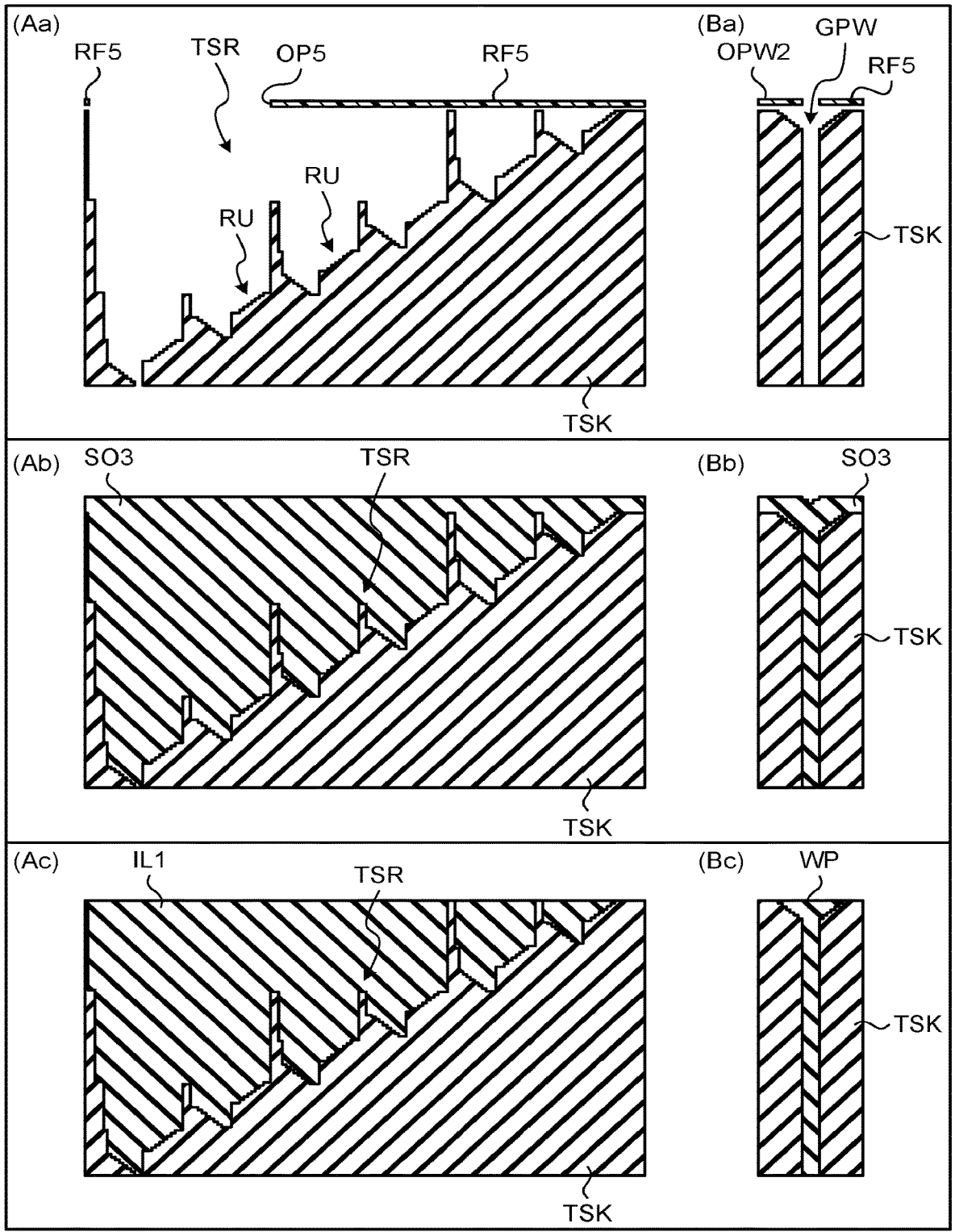
FIG. 6 is partial cross-sectional views explaining the method of forming the stair portion and the wall portion of the semiconductor storage device according to the embodiment.

Subsequently, referring to FIG. 5 and FIG. 6, an explanation is made on a method of forming the stair portion SR and the wall portion WP. FIGS. 5 and 6 are partial cross-sectional views for explaining the method of forming the stair portion SR and the wall portion WP. Note that, in these drawings, Sections (Aa), (Ab), . . . , and the like illustrate partial cross sections of the stair portion SR, and Sections (Ba), (Bb), . . . , and the like illustrate partial cross sections of the wall portion WP. Additionally, the partial cross sections of the stair portion SR correspond to the stair area SA of FIG. 3A, and the partial cross sections of the wall portion WP correspond to FIG. 4A. Furthermore, for the sake of convenience, all layers of the stacked body TSK where the stair portion SR and the wall portion WP are formed may not necessarily be illustrated in the drawings, the stacked body TSK is illustrated which has the number of the layers appropriate for explaining each process. Additionally, illustration is also omitted about the insulating layers OL and the silicon nitride layers SN in the stacked body TSK. Moreover, as for resist films used for etching, a position of the top surface thereof is only illustrated.

Referring to Sections (Aa) and (Ba) of FIG. 5, a resist film RF1 is formed on a top surface of the stacked body TSK formed on the source line SL (not illustrated). The resist film RF1 has plural openings OP1 within a location where the stair portion SR is to be formed. Additionally, the resist film RF1 has an opening OPW1 at a position where the wall portion WP is to be formed. Here, one pair of the insulating layer OL and the silicon nitride layer SN of the stacked body TSK is etched using the resist film RF1; the resist film RF1 is slimmed (namely, the openings OP1, OPW1 are enlarged); and another pair of the insulating layer OL and the silicon nitride layer SN of the stacked body TSK is etched using the slimmed resist film RF1. Then, this procedure is repeated predetermined times. With this, a stair portion SR1 having plural pairs of the silicon nitride layer SN and the insulating layer OL as steps is formed as illustrated in Sections (Aa) and (Ba) of FIG. 5. Here, a reactive ion etching (RIE) method may be employed for this etching.

The stair portion SR1 has a right-down stair RD that descends from an upper surface US to a bottom surface LS and a right-up stair RU that ascends from the bottom surface LS to another upper surface US. In the stair RD, RU, the insulating layer OL within the stacked body TSK is exposed as the terrace surface. The stairs RD, RU are symmetric with each other with respect to the center of the opening OP1 in the x direction in the x-z cross section by the repetition of above-mentioned etching and slimming. Note that the stair portion SR1 formed by the processes so far is also formed in a position where the wall portion WP is to be formed, and this stair portion SR1 (Section (Ba) of FIG. 5) corresponds to the funnel portion WP1. Namely, in the funnel portion WP1, the side surfaces on the left and right sides in FIG. 4A are also symmetric with each other with respect to the center of the opening OPW1 in the x direction.

Then, the resist film RF1 is removed, and instead a resist film RF2 is formed as illustrated in Sections (Ab) and (Bb) of FIG. 5. The resist film RF2 has openings OP2 and OPW2. Through the openings OP2, an area from substantially a center of the bottom surface LS of the stair portion SR1 illustrated in Section (Aa) of FIG. 5, through the right-down stair RD, to substantially a center of the upper surface US is exposed. Additionally, the opening OPW2 for the wall portion WP has a width that is the same as the initial opening OPW1 (namely, the opening OPW1 before the slimming) of the resist film RF1. When the stacked body TSK is etched collectively using the resist film RF2, the right-down stair RD is lowered as a whole with respect to the right-up stair RU. In other words, the right-down stair RD formed by the repetition of the above-mentioned etching and slimming is transferred to the lower layers of the stacked body TSK. Even in this case, the insulating layers OL are exposed as the terrace surfaces in the right-down stair RD.

Additionally, beneath the opening OPW2 of the resist film RF2, a slit GPW is formed which has substantially the same opening size as the opening OPW2. However, due to variations in process conditions and characteristics of an etching apparatus to be used, the width (a length in the x direction) of the slit GPW may become smaller toward the bottom end thereof and may be partially larger. Alternatively, the slit GPW may also be curved. In such cases, the rising portion WP2 of the wall portion WP formed by filling, for example, silicon oxide into the slit GPW may also be narrower towards the bottom end thereof and become partially larger, and may be curved. Even in this case, it can be said that the wall portion WP rises from the top surface of source line SL in the z direction.

Subsequently, as illustrated in Sections (Ac) and (Bc) of FIG. 5, a resist film RF3 is formed on the stacked body TSK instead of the resist film RF2. The resist film RF3 has openings OP3 and OPW2. Every other pair of the right-down stair RD and the right-up stair RU is exposed through the corresponding opening OP3. On the other hand, the opening OPW2 has substantially the same opening size and opens at substantially the same position as the opening OPW2 of the resist film RF2. When the stacked body TSK is further etched using the resist film RF3, as illustrated in Sections (Ac) and (Bc) of FIG. 5, the pairs of the right-down stair RD and the right-up stair RU exposed through the corresponding openings OP3 are lowered as a whole with respect to the other adjacent pairs of the right-down stair RD and the right-up stair RU. Additionally, beneath the opening OPW2 of the resist film RF3, the slit GPW is further etched and thus deeper in the z direction.

Figure 7:
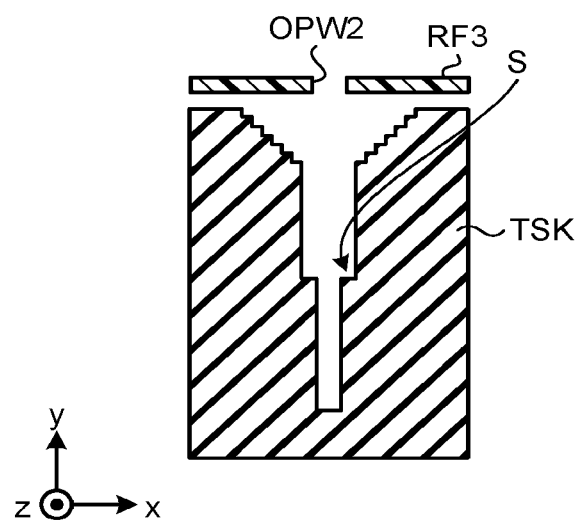
FIG. 7 is a view illustrating a modified example of the method of forming the wall portion of the semiconductor storage device according to the embodiment.

Note that a positional deviation may occur between the opening OPW2 of the resist film RF3 and the opening OPW2 of the resist film RF2 (FIG. 5) used in the previous etching. In this case, an inner side surface of the slit GPW formed by this etching and an inner side surface of the slit GPW formed by the previous etching is not continually linked, and thus a step may be caused therebetween. Additionally, taking such a positional deviation into consideration, a width (a length of the x direction) of the opening OPW2 of the resist film RF3 may be set smaller than a width of the opening OPW2 of the resist film RF2. In this case, the width of the slit GPW may become narrower so that a step S is caused along an etching advancing direction (the z direction), as illustrated in FIG. 7, which is a cross-sectional view schematically illustrating a modified example of the method for forming the wall portion WP1. Additionally, such a step may also be caused on a side surface of the rising portion WP2 of the wall portion WP formed by filling the slit GPW with an insulating material (e.g., silicon oxide) as described later. Namely, the width of the rising portion WP2 may be narrower downward (or toward the source line SL (FIG. 4A)) in a stepped manner.

Next, as illustrated in Sections (Ad) and (Bd) of FIG. 5, a resist film RF4 is formed on the stacked body TSK instead of the resist film RF3. The resist film RF4 has openings OP4 and OPW2. Four adjacent pairs of the right-down star RD and the right-up stair RD are exposed through the opening OP4. On the other hand, the opening OPW2 has substantially the same opening size and opens at substantially the same position as the opening OPW2 of the resist film RF3. When the stacked body TSK is further etched using the resist film RF4, as illustrated in Sections (Ad) and (Bd) of FIG. 5, the four adjacent pairs of the right-down star RD and the right-up stair RD, which are exposed through the opening OP4, are lowered as a whole. Additionally, beneath the opening OPW2 of the resist film RF4, the slit GPW is further etched and thus deeper in the z direction. Even in this case, the step S may also be caused between the inner side surface of the slit GPW formed by this etching and the inner side surface of the slit GPW formed by the previous etching. Additionally, the width of the slit GPW and thus the rising portion WP2 of the wall portion WP may be narrower in a stepped manner.

Subsequently, as illustrated in Sections (Aa) and (Ba) of FIG. 6, a resist film RF5 is formed on the stacked body TSK instead of the resist film RF4. The resist film RF5 has openings OP5 and OPW2. Two pairs of the right-down star RD and the right-up stair RD out of four pairs of the right-down star RD and the right-up stair RD in the left hand side of the drawing are exposed through the opening OP5. On the other hand, the opening OPW2 has substantially the same opening size and opens at substantially the same position as the opening OPW2 of the resist film RF4. When the stacked body TSK is further etched using the resist film RF5, as illustrated in Sections (Aa) and (Ba) of FIG. 6, two pairs of the right-down star RD and the right-up stair RD exposed through the opening OP5 are lowered as a whole. Here, referring to Section (Aa) of FIG. 6, the right-up stair RU and the right-down stair RD are arranged alternately with each other, and the right-up stair RU constitutes substantially one right-up slope. With these processes so far, all the insulating layers OL in the stacked body TSK are exposed as the terrace surfaces, and thus the stair portion TSR is obtained. Additionally, beneath the opening OPW2 of the resist film RF5, the slit GPW is further etched and deeper in the z direction, and thus arrives at a bottom of the stacked body TSK, namely the upper surface of the source line SL (not illustrated here).

Next, as illustrated in Sections (Ab) and (Bb) of FIG. 6, an insulating film SO3 is formed over the stacked body TSK where the stair portion TSR and the slit GPW have been formed. The insulating film SO3 may be formed of, for example, silicon oxide. With this, the stair portion TSR is buried by the insulating film SO3, and the slit GPW is also buried by the insulating film SO3. Then, the insulating film SO3 formed over the stacked body TSK is removed, for example, by a chemical mechanical polishing (CMP) method. With this, the inter-layer insulating film IL1 is formed over the stacked body TSK having the stair portion TSR formed therein, and an upper surface of the funnel portion WP1 of the wall portion WP is exposed, as illustrated in Sections (Ac) and (Bc) of FIG. 6.

Subsequently, the insulating film SO1 (FIG. 3B) is formed on the stacked body TSK, the inter-layer insulating film IL1, and the wall portion WP. Then, plural holes (not illustrated) for the memory pillars MP are formed in the cell array area CA (FIG. 2), using a photolithography and etching technique. The memory pillars MP are formed by sequentially forming the memory film MEM, the channel layer CHN, and the core layer COR in this order on an inner peripheral surface of each hole (FIG. 3A). Note that, in parallel with forming the memory pillars MP, supporting pillars (not illustrated) may be formed which support the stacked body TSK having the sacrificial films removed at the time of replacing process where the sacrificial films are replaced with the electrically conductive layers described later.

Additionally, the slits GP (cf. FIG. 9) for the plate-shaped portions ST and slits (not illustrated) for the plate-shaped bodies OST are formed using the photolithography and etching technique. The slits for the plate-shaped bodies OST are filled with, for example, silicon oxide, and thus the plate-shaped bodies OST are formed. Then, the electrically conductive layers WL are formed by removing the silicon nitride layers SN of the stacked body TSK using an etching process through the slits GP, and filling metal such as tungsten, molybdenum, or the like into spaces formed by removing the silicon nitride layers SN. With this, the stacked body SK, which has the stair portion SR, is provided (FIG. 3A). Note that, in an area between the two plate-shaped bodies OST within the through-contact portion C4A, the etching is blocked by the plate-shaped bodies OST formed of silicon oxide, and thus the silicon nitride layers SN remain without being etched (FIG. 3B). Namely, the stacked body TSK remains between the two plate-shaped bodies OST. After this, the slits GP for plate-shaped portions ST are filled with the liner layer LL and then the electrically conductive portion EC (FIG. 2). With this, the plate-shaped portions ST are obtained.

Then, the contacts CC (FIG. 3A) are formed which penetrate through the insulating film SO1 and the inter-layer insulating film IL1; and the through-contacts C4A are formed which penetrate through the insulating film SO1 and the stacked body TSK remaining in the through-contact portion C4A, and then reach a predetermined electric line ML of the peripheral circuit portion PER. The insulating film SO2 (FIG. 3B) is formed on the structure obtained so far. Next, the plugs C4P and the plugs CCP are embedded within the insulating film SO2. The plugs C4P are connected to the upper end of the corresponding contacts CC; and the plugs CCP are connected to the corresponding upper ends of the through-contacts C4. Subsequently, an upper electric line UL is formed to be connected with the plugs CCP, C4P.

Note that, after the inter-layer insulating film IL1 is formed, another one of the stacked body TSK may be formed thereon, and a series of processes explained referring to FIGS. 5 and 6 may be repeated. FIG. 8 is a cross-sectional view schematically illustrating the stair portions formed in two tiers by repeating such processes. A stair portion TSRt1 in an area T1 in Section (a) of FIG. 8 is substantially the same as the stair portion TSR illustrated in Section (Ac) of FIG. 6. At the upper right in relation to the stair portion TSRt1, a stair portion TSRt2 is formed which extends successively with the stair portion TSRt1, and an inter-layer insulating film IL3 is formed which allows the stair portion TSRt2 to be buried. Additionally, in parallel with forming the stair portions TSRt1, TSRt2 and inter-layer insulating films IL1, IL3, wall portions WPt1, WPt2 are formed (Section (b) of FIG. 8). The wall portion WPt1 is the same as the above-mentioned wall portion WP, and the wall portion WPt2 is formed in substantially the same shape as the wall portion WPt1 on the wall portion WPt1. When the stair portions TSRt1, TSRt2 are formed by repeating the processes of FIGS. 5 and 6 in such a manner, because the number of the electrically conductive layers WL (word lines) may be substantially doubled when the silicon nitride layers SN of the stacked body TSK are replaced with the electrically conductive layers WL, the number of the memory cells can be also doubled. Namely, memory capacity of the semiconductor storage device 1 can also be increased. Additionally, the additional stair portions may be provided on the inter-layer insulating film IL3 by further repeating the processes of FIGS. 5 and 6.

Figure 9A:
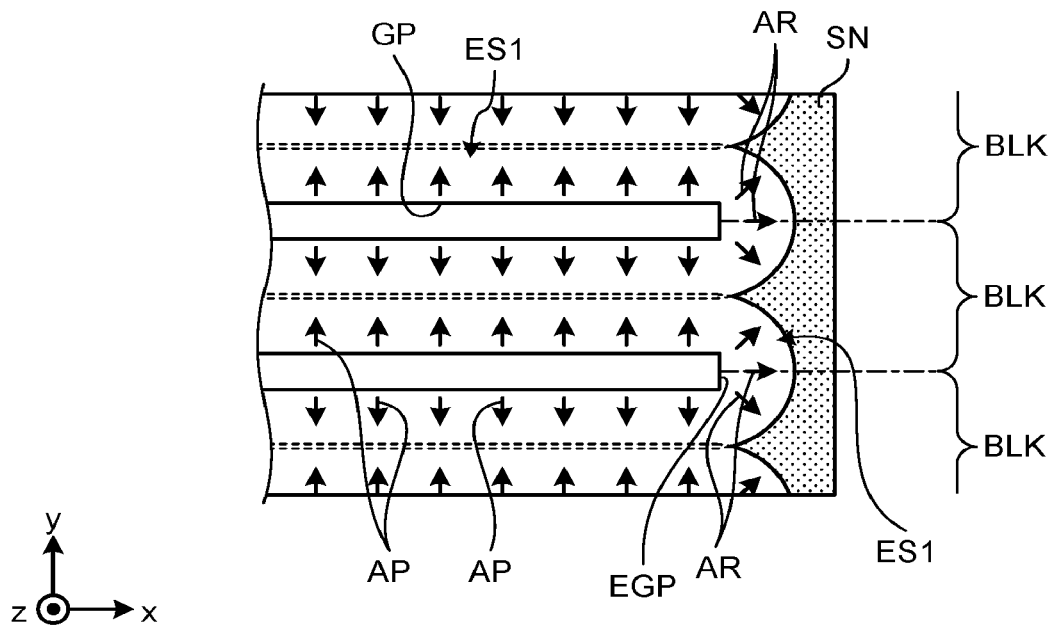
FIG. 9A is a top plan view schematically illustrating a silicon nitride layer of a stacked body in an end portion of a cell array area of a semiconductor storage device according to a comparative example.
Figure 9B:
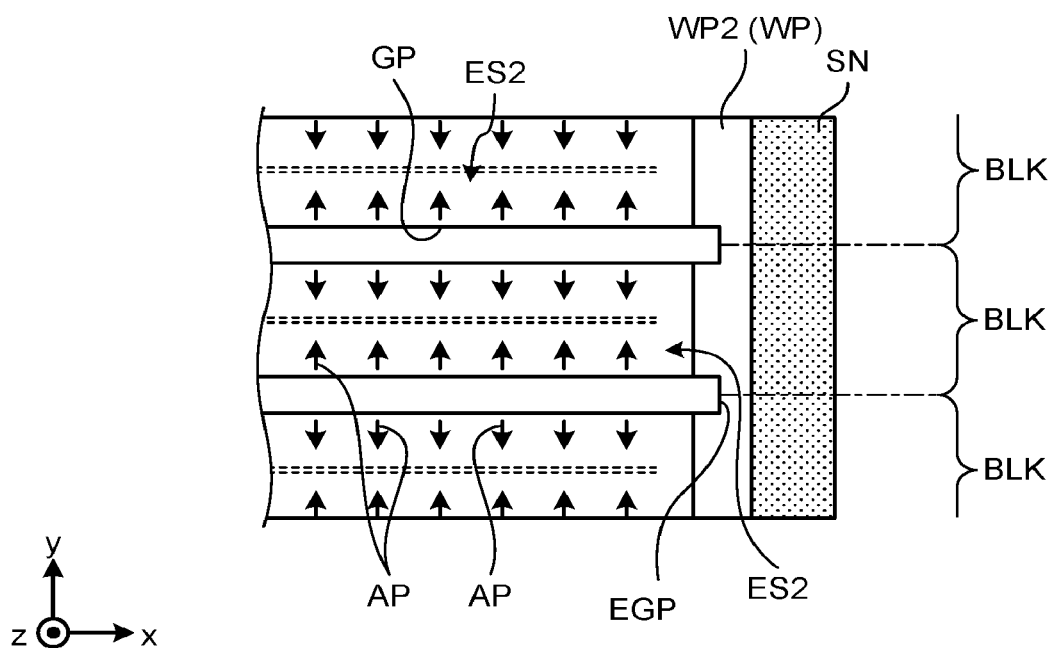
FIG. 9B is a top plan view schematically illustrating a silicon nitride layer of the stacked body in an end portion of the cell array area of the semiconductor storage device according to the embodiment.

Next, referring to a comparative example, an explanation is made on effects brought about by the semiconductor storage device 1 according to the embodiment. FIG. 9A is a top plan view schematically illustrating the silicon nitride layer of the stacked body in an end portion of the cell array area of the semiconductor storage device according to the comparative example. FIG. 9B is a top plan view schematically illustrating the silicon nitride layer of the stacked body in an end portion of the cell array area CA of the semiconductor storage device 1 according to the embodiment.

As described above, when the electrically conductive layer WL is formed, first, the silicon nitride layer SN of the stacked body TSK is etched, leaving a space ES1, which is then filled with a metal such as tungsten and the like, and thus the electrically conducive layer is formed. The etching of silicon nitride layer SN is performed by injecting an etching solution from the slit GP for the plate-shaped portion ST. In FIG. 9A, the etching advances not only in a direction perpendicular to a longitudinal direction (x direction) of the slit GP as indicated in arrows AP but also in substantially a semicircle shape from an end portion EGP of the slit GP. Therefore, when the wall portion WP is absent, the space ES1 formed by etching to remove the silicon nitride layer SN extends beyond the end portion EGP of the slit GP in the x direction. After this, when the electrically conductive layer WL is formed by filling a metal into the space ES1, the electrically conductive layer WL also extends beyond the end portion EGP of the slit GP in the x direction. In this case, the electrically conductive layer WL extending beyond the end portion EGP of the slit GP in the x direction in one block BLK is merged into the electrically conductive layer WL extending beyond the end portion EGP of the slit GP in the x direction in the adjacent block BLK. Namely, the electrically conductive layer WL in the adjacent blocks BLK are electrically conductive, which ruins electrical division of the cell array area CA into the plural blocks BLK by the plate-shaped portions ST. In other words, a function of the plate-shaped portion ST to divide electrically the cell array area CA into the plural blocks BLK is ruined.

On the other hand, in the semiconductor storage device 1 according to the present embodiment, the wall portion WP is present as illustrated in FIG. 9B. Additionally, the slit GP for the plate-shaped portion ST extends in the x direction, and the end portion EGP is located within the wall portion WP (the rising portion WP2 in the illustrated example). Moreover, the wall portion WP is formed of silicon oxide having etching tolerance against the etching solution for silicon nitride. Therefore, the silicon nitride layer SN is prevented from being etched beyond the end portion EGP in the x direction. Namely, a space ES2 formed by removing the silicon nitride layer SN cannot extend beyond the end portion EGP of the slit GP in the x direction. Therefore, even when the electrically conductive layer WL is formed, the electrical division between the blocks BLK is maintained. Herein, it may be described that the wall portion WP terminates the stacked body SK where the plural electrically conductive layers WL and the insulating layers OL are stacked alternately one by one (in other words, the cell array area CA where the memory pillars MP penetrating through the stacked body SK are arranged) in the x direction.

Note that, in order to avoid electrical communication between the blocks BLK without providing the wall portion WP, it is conceivable, for example, that the stacked body TSK is processed into stairs in a vicinity of the end portion EGP of the slit GP (plate-shaped portion ST) thereby to form a stair portion (or a dummy stair portion). According to this, the silicon nitride layers SN within the stacked body TSK can be kept away from the end portion EGP of the slit GP in stages, and thus a space formed after the removal of the silicon nitride layer SN is prevented from extending beyond the end portion EGP in the x direction. With this, the electrical communication between the blocks BLK can be prevented after the electrically conductive layers WL are formed. However, in this case, the stacked body TSK is processed into stairs in the vicinity of the end portion EGP, and an area above and next to the stairs (namely, an area between the two memory portions) needs to be filled with, for example, a silicon oxide film, which is then polished. Therefore, when there are the greater number of steps of the stairs (namely, the number of the silicon nitride layers SN in the stacked body TSK), a relatively larger area needs to be filled with silicon oxide, which results in increased material costs.

However, in the present embodiment, it is not necessary to process all the layers of the stacked body TSK into stairs in the vicinity of the end portion EGP of the slit GP (the plate-shaped portion ST). Namely, in this embodiment, the slit GPW (Section (Ba) of FIG. 6) for the rising portion WP2 is formed in most layers of the stacked body TSK, the slit GPW having a ratio H/Wl, which exceeds 0.5, of the width to the height. Then, the slit GPW of such a high aspect ratio is filled with a relatively little amount of an insulating material. Therefore, it is not necessitated to form a silicon oxide film in a very large area, or to polish a relatively large amount of the silicon oxide film. Therefore, according to this embodiment, the electrical division between the blocks BLK can be realized by simple and less expensive processes without increasing material costs and adding inherently unnecessary processes.

Additionally, the plate-shaped portions ST terminate within the source line SL, as illustrated in FIG. 3B, while the wall portion WP penetrates through the stacked body TSK and terminates near the top surface of source line SL, as illustrated in FIG. 4A. Namely, the bottom surfaces of the slits GP for plate-shaped portions ST are located deeper than the bottom surface of the slits GPW (Section (Ba) of FIG. 6) for the wall portions WP. The slits GP for the above-mentioned plate-shaped portions ST are formed after the stair portions TSR and the wall portions WP are formed to penetrate through the inter-layer insulating film IL1, the stacked body TSK, and the wall portion WP. Namely, a height difference is caused between the bottom surfaces of the wall portion WP and the plate-shaped portion ST, because the wall portions WP are formed in parallel with the stair portion SR, and then the slits GP for the plate-shaped portions ST are formed, according to the manufacturing method of the present embodiment. Therefore, even when the plate-shaped portion ST is formed, as a whole, of an insulating material such as silicon oxide which is the same as the wall portion WP, a portion corresponding to the wall portion WP and the plate-shaped portion ST can be certainly identified as separate entities, in the semiconductor storage device 1 according to the present embodiment.

Additionally, in the present embodiment, because the wall portion WP is formed in parallel with forming the stair portion SR, additional processes exclusively for forming the wall portion WP are not necessitated. Namely, the wall portion WP can be formed without unnecessarily increasing production costs.

Moreover, in the semiconductor storage device 1 according to this embodiment, end portions of the stacked body SK where the plural electrically conductive layers WL and the plural insulating layers OL are stacked alternately one by one, the end portions extending along the y direction, are defined by an abutting surface of the stacked body SK and the wall portion WP. Additionally, the other end portions of the stacked body SK, the other end portions extending along the x direction, are defined by a boundary surface of the silicon nitride layers SN that are not removed by being not exposed to the etching solution injected into the slits GP on both sides of the y direction and the corresponding electrically conductive layers WL that are formed by being replaced with the silicon nitride layers SN through the slits GP. With this, the encompassing portion 20 that encompasses the memory portion 10 (FIG. 1) is formed of the stacked body TSK where the plural silicon nitride layers SN and the plural insulating layers OL are stacked alternately one by one. Here, a scribe line along which a semiconductor substrate such as a silicon wafer and the like having plural semiconductor storage devices 1 formed thereon is severed into individual semiconductor storage devices 1 can be set within the encompassing portion 20, namely within the stacked body TSK. Therefore, the scribe line is not necessarily provided within the stacked body SK including the electrically conductive layers WL, and thus contamination can be reduced at the time of scribing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Figure 10:
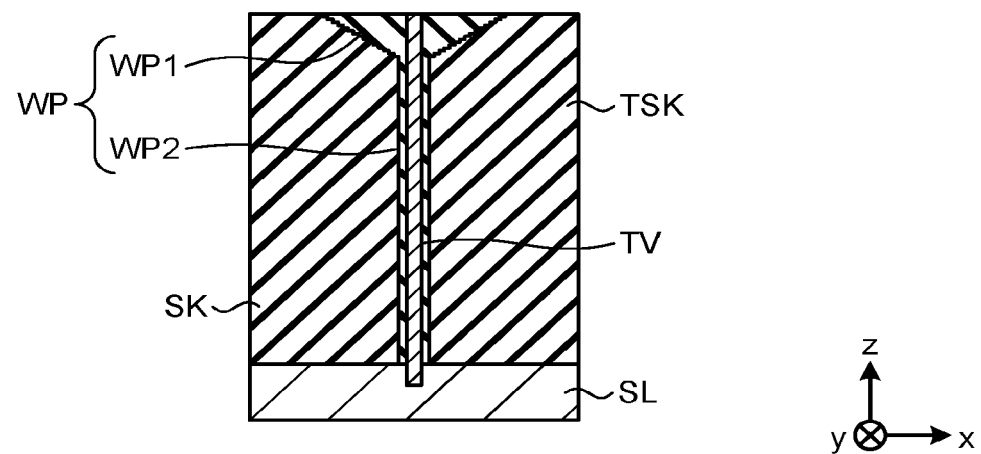
FIG. 10 is a cross-sectional view schematically illustrating a through-via that is formed inside the wall portion of the semiconductor storage device according to the embodiment.

As one example of changes, an electrical line portion such as a through-via may be formed within the wall portion WP. FIG. 10 is a cross-sectional view schematically illustrating a through-via TV that penetrates through the wall portion WP and terminates within the source line SL. The through-via TV penetrates through the wall portion WP in the z direction and reaches the source line SL, as illustrated in the drawing. The through-via TV may be formed by forming a hole that penetrates through the wall portion WP and terminates within the source line SL, and filling, for example, a metal such as tungsten, molybdenum, and the like into the hole. Because the wall portion WP is formed of, for example, an insulating material such as silicon oxide and the like as mentioned above, the through-via TV penetrating therethrough is electrically insulated from surroundings thereof. Additionally, the through-via TV may be connected to the upper electric lines and the like by way of a plug (not illustrated) provided on an upper end of the through-via TV. With this, the through-via TV may function as a source contact. Besides, a through-via, which acts as an electrical line portion to be connected to an electrically conductive material layer below the source line SL, for example, the electric line ML in the peripheral circuit portion PER, may be formed within the wall portion WP.

What is claimed is:

1. A semiconductor storage device comprising:
    a first stacked body in which a plurality of electrically conductive layers and a plurality of first insulating layers are stacked alternately one by one, the first stacked body including a plurality of pillar bodies that penetrate the plurality of electrically conductive layers and the plurality of first insulating layers in a stacking direction of the plurality of electrically conductive layers, wherein memory cells are formed in portions of the pillar bodies that are opposed to at least one of the plurality of electrically conductive layers;
    a plurality of plate-shaped portions that extend in a first direction intersecting the stacking direction and divide the first stacked body into a plurality of blocks, the plurality of plate-shaped portions including a first insulating material; and
    a wall portion including a second insulating material and including a first portion and a second portion, the first portion and the second portion respectively extending in a second direction intersecting the first direction and the stacking direction and being arranged in the stacking direction, the second portion including an outer edge connected to a side surface of the first portion extending in the second direction and the stacking direction, and inclined with respect to the stacking direction at an angle larger than an angle defined by the side surface and the stacking direction.

2. The semiconductor storage device according to claim 1, wherein end portions of the plurality of plate-shaped portions in the first direction are connected to the first portion of the wall portion.

3. The semiconductor storage device according to claim 1, wherein
a relationship of "H/W1>0.5" is satisfied,
where H is a length of the first portion along the stacking direction, and
W1 is a dimension of the first portion at a second-portion-side end portion along the first direction.

4. The semiconductor storage device according to claim 1, wherein a dimension of the second portion along the first direction becomes step-wisely larger in a direction farther from the first portion.

5. The semiconductor storage device according to claim 1, wherein the second portion of the wall portion includes the outer edge having a shape corresponding to a first stair portion and a second stair portion that descend from both sides of the second portion to a center of the second portion in the first direction.

6. The semiconductor storage device according to claim 5, wherein the
first stair portion and the second stair portion are symmetric with each other with respect to the center of the second portion.

7. The semiconductor storage device according to claim 6, wherein
the first stair portion includes as a step at least one pair of an electrically conductive layer and a first insulating layer among the plurality of electrically conductive layers and the plurality of first insulating layers in the first stacked body.

8. The semiconductor storage device according to claim 7, further comprising a second stacked body where a plurality of second insulating layers and a plurality of third insulating layers are stacked alternately one by one, wherein
the second stair portion includes as a step at least one pair of a second insulating layer and a third insulating layer among the plurality of second insulating layers and the plurality of third insulating layers in the second stacked body.

9. The semiconductor storage device according to claim 7, wherein the plurality of electrically conductive layers and the plurality of first insulating layers other than the electrically conductive layer and the first insulating layer included in the first stair portion are in contact with a first side surface of the first portion on the first stair portion side.

10. The semiconductor storage device according to claim 1, wherein an end portion of a cell array area in the first direction where the plurality of pillar bodies are arranged in the first stacked body and the memory cells are formed is defined by the wall portion.

11. The semiconductor storage device according to claim 10, further comprising a stair area provided with a third stair portion including as terrace surfaces the plurality of electrically conductive layers of the first stacked body, the stair area being arranged on an opposite side of the wall portion in the first direction with respect to the cell array area.

12. The semiconductor storage device according to claim 11, wherein contacts are connected to the respective terrace surfaces of the third stair portion.

13. The semiconductor storage device according to claim 11, further comprising a second stacked body in which a plurality of second insulating layers and a plurality of third insulating layers are stacked alternately one by one, wherein
the second stacked body is arranged on an opposite side of the cell array area in the first direction with respect to the wall portion and on both sides of the cell array area in the second direction.

14. The semiconductor storage device according to claim 1, wherein
the first portion of the wall portion has a step on the side surface along the stacking direction.

15. The semiconductor storage device according to claim 1, wherein
a dimension of the first portion in the first direction becomes step-wisely smaller in a direction farther from the second portion.

16. The semiconductor storage device according to claim 1, further comprising an electrically conductive material layer above which the first stacked body is provided, wherein
a lower end of the first portion of the wall portion in the stacking direction is in contact with the electrically conductive material layer.

17. The semiconductor storage device according to claim 1, further comprising:
an electrically conductive material layer provided on the first portion side of the wall portion, the electrically conductive material layer being provided in a different layer from the plurality of electrically conductive layers and the plurality of first insulating layers in the first stacked body; and
an electrical line portion penetrating through the wall portion in the stacking direction, the electrical line portion being connected to the electrically conductive material layer.

18. A semiconductor storage device comprising:
a first stacked body in which a plurality of electrically conductive layers and a plurality of first insulating layers are stacked alternately one by one, the first stacked body including a plurality of pillar bodies that penetrate the plurality of electrically conductive layers and the plurality of first insulating layers in a stacking direction of the plurality of electrically conductive layers, wherein memory cells are formed in portions of the pillar bodies that are opposed to at least one of the plurality of electrically conductive layers, and an area where the plurality of electrically conductive layers are processed in stairs being arranged between at least two areas where the memory cells are formed in a first direction intersecting the stacking direction;
a plurality of plate-shaped portions extending in the first direction and dividing the first stacked body into a plurality of blocks;
a wall portion extending in the stacking direction and in a second direction intersecting the first direction and the stacking direction, the wall portion including an insulating material and including a first outer edge and a second outer edge that are opposed to each other in the first direction, wherein each of the plurality of electrical conductive layers is in contact with the first outer edge, and end portions of the plurality of plate-shaped portions are connected with the first outer edge; and
a second stacked body in which a plurality of second insulating layers and a plurality of third insulating layers are stacked alternately one by one, the second stacked body being in contact with the second outer edge of the wall portion.

19. The semiconductor storage device according to claim 18, wherein
the wall portion includes a first portion and a second portion that are connected in the stacking direction, the first and second outer edges of the wall portion are inclined with respect to the stacking direction in the second portion larger than in the first portion, and a dimension of the second portion of the wall portion in the first direction becomes step-wisely larger as being farther from the first portion.

20. The semiconductor storage device according to claim 19, wherein the first stacked body includes a first stair portion including as a step at least one pair of an electrically conductive layer and a first insulating layer among the plurality of electrically conductive layers and the plurality of first insulating layers, wherein the electrically conductive layer and the first insulating layer included in the first stair portion are in contact with the first outer edge of the wall portion in the second portion of the wall portion, and the second stacked body includes a second stair portion including as a step at least one pair of second and third insulating layers among the plurality of second insulating layers and the plurality of third insulating layers, wherein the second and third insulating layers included in the second stair portion are in contact with the second outer edge of the wall portion in the second portion of the wall portion.

* * * * *